United States Patent
To et al.

(10) Patent No.: US 6,941,484 B2
(45) Date of Patent: Sep. 6, 2005

(54) SYNTHESIS OF A SYNCHRONIZATION CLOCK

(75) Inventors: Hing Y. To, Folsom, CA (US); Joseph H. Salmon, Placerville, CA (US); Michael W. Williams, Citrus Heights, CA (US)

(73) Assignee: Intel Corporation, Santa Clara, CA (US)

(*) Notice: Subject to any disclaimer, the term of this patent is extended or adjusted under 35 U.S.C. 154(b) by 676 days.

(21) Appl. No.: 10/090,080

(22) Filed: Mar. 1, 2002

(65) Prior Publication Data

US 2003/0167417 A1 Sep. 4, 2003

(51) Int. Cl.[7] .................................. G06F 1/12
(52) U.S. Cl. ............... 713/500; 713/375; 713/400; 713/401; 713/500; 713/501; 713/502; 713/503; 375/354; 375/355; 375/368; 375/371; 326/93; 711/167
(58) Field of Search ............... 713/400, 401, 713/500, 600, 375, 503; 375/354, 355, 368, 371; 326/93; 711/167

(56) References Cited

U.S. PATENT DOCUMENTS

| | | | | |
|---|---|---|---|---|
| 4,808,884 A | * | 2/1989 | Hull et al. | ............ 375/376 |
| 5,058,142 A | * | 10/1991 | Otsuka | ............ 375/374 |
| 5,574,756 A | * | 11/1996 | Jeong | ............ 375/376 |
| 5,963,502 A | * | 10/1999 | Watanabe et al. | ............ 365/233 |
| 6,178,212 B1 | * | 1/2001 | Akashi | ............ 375/355 |
| 6,212,249 B1 | * | 4/2001 | Shin | ............ 375/376 |
| 6,369,627 B1 | * | 4/2002 | Tomita | ............ 327/158 |
| 6,715,096 B2 | * | 3/2004 | Kuge | ............ 713/600 |

FOREIGN PATENT DOCUMENTS

JP   2001056723 A  *  2/2001  ............ G06F/1/10

* cited by examiner

*Primary Examiner*—Lynne H. Browne
*Assistant Examiner*—Nitin C. Patel
(74) *Attorney, Agent, or Firm*—Blakely, Sokoloff, Taylor and Zafman (57) ABSTRACT

A method, system, and device capable of generating one or more clocks internally to detect, sample, and receive synchronous data streams and eliminate the need for corresponding external synchronization clocks for each data stream. One aspect of the clock generator provides a two-stage interpolation system. In a first stage, two clocks are selected which accurately detect a calibration data sample. In a second stage, a single, fine-tuned, clock is synthesized by interpolating the two selected clocks.

30 Claims, 7 Drawing Sheets

SYNTHESIS OF A SYNCHRONIZATION CLOCK

FIELD

The invention pertains generally to memory devices, and more particularly to clock generation for data capture.

BACKGROUND

Traditionally, memory controllers have relied on external clocks to be able to write data to or read data from a synchronous memory subsystem (e.g. memory storage devices). Providing these clocks between the memory controller and the memory subsystem typically involves the use of multiple pins on memory controller modules and memory subsystems. These pins and clock traces on controller modules and memory subsystems often consume much needed space on the memory subsystem's board, module, or interface.

Figure 1:
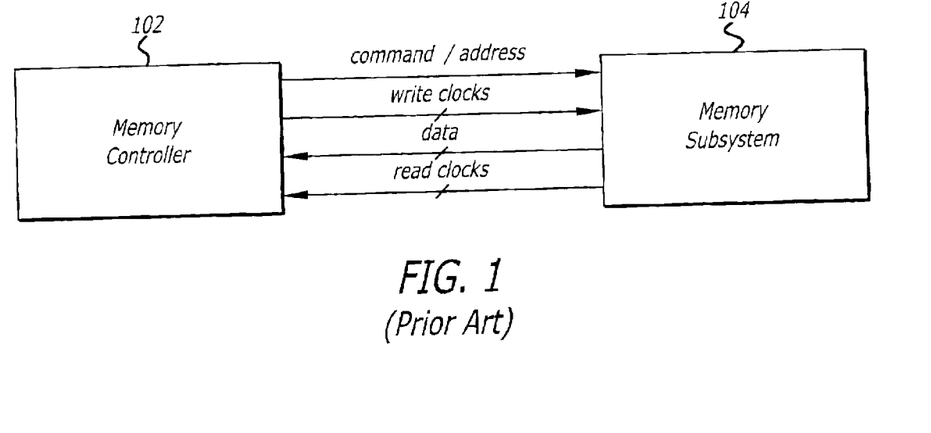
FIG. 1 is a block diagram illustrating one embodiment of a conventional interface between a memory controller module and a memory subsystem.

FIG. 1 illustrates a conventional prior art memory controller 102 and memory subsystem 104 configuration. In computer implementations, the memory controller 102 is typically a component on the motherboard which manages communications to and from the memory subsystem 104. A memory subsystem 104 is typically a separate module (such as a dual in-line memory module (DIMM) or single in-line memory module (SIMM)) which stores and provides data as directed by the memory controller.

A typical memory controller-to-memory subsystem interface includes a bus with multiple command/address lines, data lines, write clock lines, and/or read clock lines. The command/address lines allow the memory controller 102 to indicate to the memory subsystem 104 to store data or retrieve data. The data lines (either bi-directional or uni-directional) serve to transmit data between the memory controller 102 and the memory subsystem 104.

When the memory controller 102 stores or writes data to the memory subsystem 104, it provides the memory subsystem 104 a clock (write clock) from which to synchronize and sample the data sent. That is, the memory subsystem 104 needs a clock from which to synchronize the data received over the data lines so that it may be correctly detected. Where multiple data lines are used, the memory controller typically provides one clock per one or more data lines.

Similarly, the memory controller 102 needs to synchronize and sample data retrieved from the memory subsystem 104. Conventionally, the memory subsystem provides read clocks to the memory controller for this purpose. Typically, the memory controller 102 provides one clock per one or more data lines. Thus, when the number of data lines increase so do the number of corresponding clock lines, inputs, pins, and/or traces.

Dynamic random access memory (DRAM) is a common type of memory storage device used in computers and other electronic devices. As described above, traditional synchronous DRAM (SDRAM) memory subsystems employ externally generated clocks to synchronize writing data to and reading to from a DRAM module. In the case of double data rate (DDR) DRAMs, additional strobe lines are employed to enable the rate doubling. For example, in DDR SDRAM systems, a system clock plus one strobe per four to eight data bus lines is typically employed to read data. On a sixty-four bit/line wide memory data bus this equates to eight to sixteen read clock signal pins on the controller, motherboard, and/or memory module connector.

As the speed of memory subsystems and data transmission increase, the number of clocks and strobes needed to achieve reliable data transmission increases, adding to the cost and detracting from the feasibility of designing and implementing such subsystems.

DETAILED DESCRIPTION

In the following detailed description of the invention, numerous specific details are set forth in order to provide a thorough understanding of the invention. However, the invention may be practiced without these specific details. In other instances well known methods, procedures, and/or components have not been described in detail so as not to unnecessarily obscure aspects of the invention.

In the following description, certain terminology is used to describe certain features of the invention. For instance, 'frame' includes any block or arrangement of data or information. The term 'data' includes voice, text, address and/or control information, and/or any other type of information. The term 'external clock' includes any clock transmitted by a data transmitting device to a data receiving device to permit the data receiving device to sample a data stream transmitted by the data transmitting device. The term 'internal clock' includes clocks not transmitted by the data transmitting device, and clocks generated by the receiving device. Additionally, memory subsystem refers to all types of memory storage devices including DRAM, SDRAM, and DDR DRAM.

One aspect of the invention provides a system, device, and method to eliminate the need to provide external read clock(s) (synchronization clock) for a device to synchronize and sample incoming data signals. By providing an internal read clock, the invention decreases or reduces the number of pins/inputs on the device and the number of clock lines employed at an interface.

For purposes of illustration, various examples described herein employ a memory controller and memory subsystem configuration. However, it should be clearly understood that the scope of the invention is not limited to practicing the invention on memory controllers and memory subsystems. The invention may be practiced in any electronic device which may benefit from the use of one or more internal clocks to synchronize one or more incoming data channels thereby avoiding the need for additional external clock pins or reducing pins/lines on the device.

Figure 2:
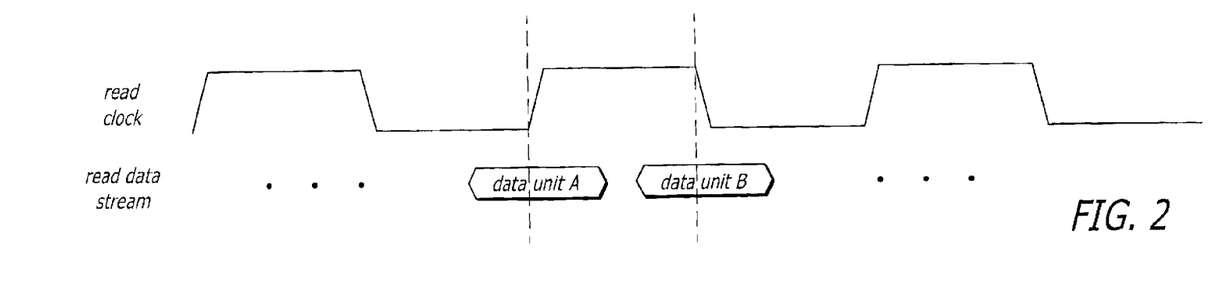
FIG. 2 is a signal diagram illustrating how a synchronous data signal is typically sampled by a clock.

For proper channel synchronization, a receiving device should be capable of accurately and reliably detecting/reading each data unit or sample received. FIG. 2 illustrates how a read clock (synchronization clock) is employed to sample two data units (A and B). Accurate and reliable detection of data units is typically accomplished by sampling data away from the edges of the data unit. That is, the edges of a data unit may shift slightly from sample to sample, resulting in erroneous readings if the data unit is sampled close to the edges. Thus, it is preferable to sample a data unit in the middle region of the data unit as shown in FIG. 2. Note that data may be read, detected, or sampled on clock transitions. For example, the read data stream may be sampled on both the rising and falling edges of the read clock signal. In other embodiments, a data stream may be sampled on either the rising or falling edge only.

Figure 3:
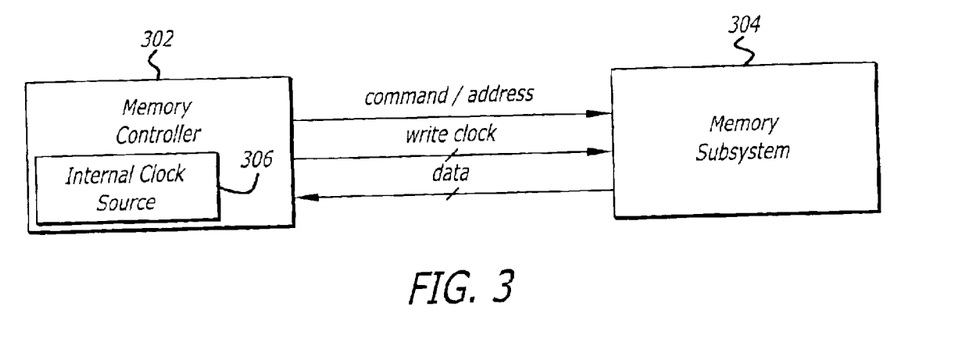
FIG. 3 is a block diagram of a device configuration embodying one implementation of the internal clock generator aspect of the invention.

Referring to FIG. 3, a block diagram of a device configuration embodying one implementation of the internal clock generator aspect of the invention is shown. A memory controller 302 is communicatively coupled to a memory subsystem 304 to write data to and read data from the memory subsystem 304. According to one implementation, the memory controller may be part of a computer motherboard while the memory subsystem may be a separate component (such as a DIMM or SIMM). One or more data lines, write clock lines, and command/address lines serve to transmit data and/or signals between the memory controller 302 and the memory subsystem 304. An internal clock source 306 within the memory controller 302 generates one or more internal clocks which may be used as write clocks when transmitting data or internal read clocks (synchronization clocks) when receiving data. As a result of the internal read clocks the need for external read clock lines from the memory subsystem 304 to the memory controller 302 is avoided.

According to one aspect of the invention, the internal clock source 306 is used to 1) provide external clocks (write clocks) for source synchronous transmission of data written and commands/addresses sent to the memory subsystem 304 and 2) to provide a root clock to interpolator circuits that generate a number of internal clocks (read clocks/synchronization clocks) for the purpose of sampling data read from the memory subsystem 304.

In one implementation, the internally generated clocks 306 are of sufficient accuracy and phase alignment to be useful in sampling the data received from the memory subsystem 304.

Figure 4:
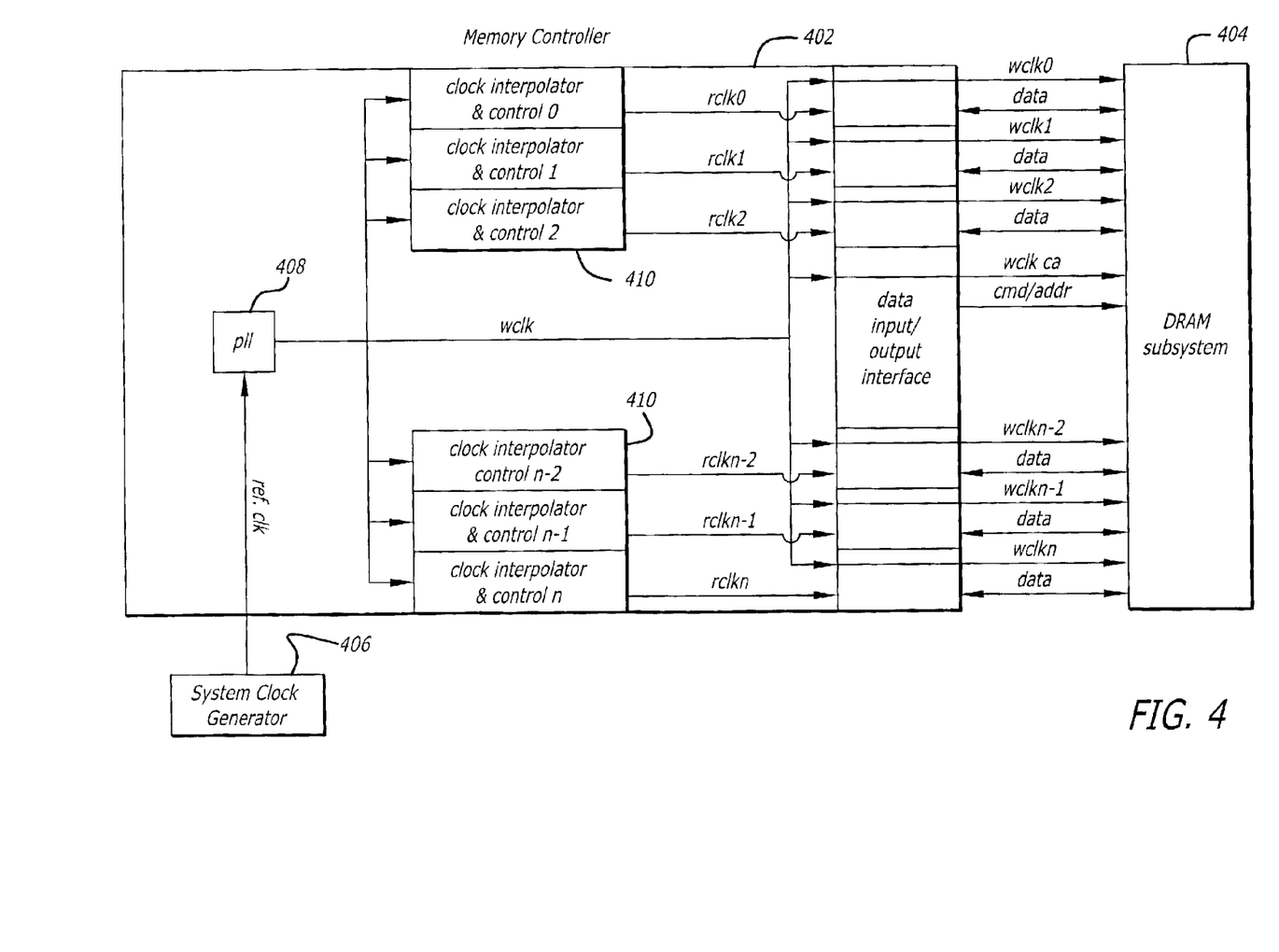
FIG. 4 is a block diagram illustrating one implementation of an internal clock generator within a memory controller coupled to a DRAM memory subsystem according to one embodiment of the invention.

FIG. 4 is a block diagram illustrating one implementation of an internal clock source or generator 306 (FIG. 3) within a memory controller 402 coupled to a DRAM memory subsystem 404 according to one embodiment of the invention. A clock generator or source 406, serves as a reference clock for the controller 402. This reference clock 406 goes to a phase locked loop circuit (pll) 408 that generates one or more clocks for synchronizing write data wclk (e.g. wclk0–wclkn) and command/address information (wclk_ca) transmitted to the DRAM subsystem 404. The wclk signal from the pll 408 also serves as input to one or more clock interpolator circuits 410 (e.g. interpolators 410A and 410B). The interpolator circuits 410 generate or synthesize read clocks (rclk0–rclkn) for synchronizing received data/read data transmitted from the DRAM subsystem 404 to the memory controller 402. The number of interpolator circuits 410 is determined by the width of the data bus and accuracy needed to provide read clock edge placement within the received signal data units. Unlike the conventional read/synchronization clocks which are typically generated by the transmitting device (e.g. memory subsystem 404), read clocks (rclk0–rclkn) are synthesized from a reference clock 406 independent from the transmitting device and without a dedicated synchronizing clock line between the receiving device and the transmitting device.

Figure 5:
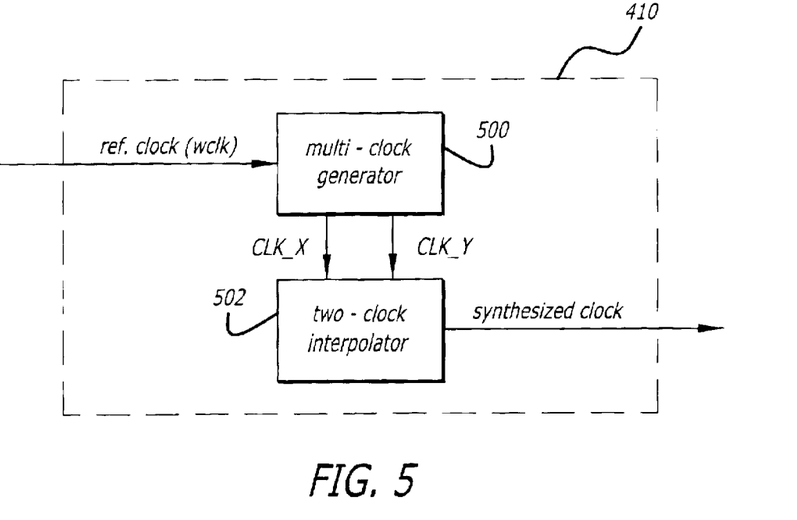
FIG. 5 is a block diagram illustrating the two stages of the invention—a multi-clock generator followed by a clock interpolator.

According to one implementation, illustrated in FIG. 5, each interpolator circuit 410 comprises a first subsystem 500, a multi-clock generator which generates one or more clocks of different phases, and a second subsystem 502, an interpolator which interpolates between two of the generated clocks clk_x and clk_y to generate a single synthesized clock, to accurately detect and synchronize a received data signal.

Figure 6:
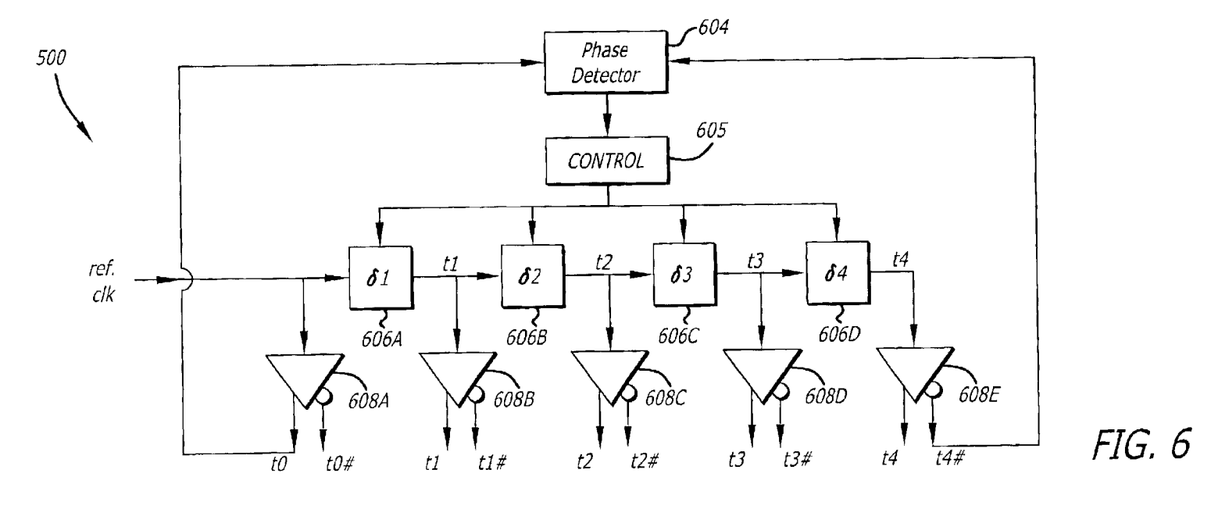
FIG. 6 illustrates a block diagram of one embodiment of a multi-clock generator to generate multiple clocks from a reference clock according to one aspect of the invention.

FIG. 6 illustrates a block diagram of one embodiment of a multi-clock generator 500 which generates multiple clocks from a reference clock (ref clk). In one implementation, the multi-clock generator 500 provides a full three hundred sixty (360) degrees of possible phase shift for the read clocks. By providing a full three hundred sixty (360) degrees of possible phase shift, full flexibility in read clock edge placement is achieved.

Figure 7:
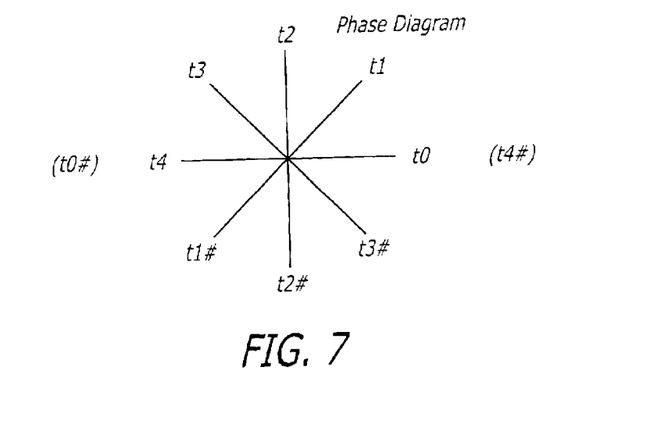
FIG. 7 is a diagram illustrating the different clock phases that may be generated by a multi-clock generator according to one implementation of the invention.

According to one embodiment, multiple phase shifted clocks may be generated by chaining together programmable delay cells (δ1–δ4) and sending clocks from both ends of the delay chain to a phase detector 604. Each delay cell (δ1–δ4) generates a phase delayed clock (e.g. t1, t2, etc,). For each clock generated (e.g. t0, t1, etc.) a corresponding inverted clock (e.g. t0#, t1#, t2#, etc.), approximately one hundred eighty (180) degree delayed, is also provided as illustrated by FIG. 7. Drivers 608A-E coupled to the delay cells (δ1–δ4) serve to receive a clock and provide both the clock (e.g. to) and its inverted version (e.g. t0#) as outputs. The phase detector 604 detects the phase difference between its two input clocks (e.g. t0 and t4#) and provides an error signal to a controller 605.

In one embodiment, the phase detector 604 is a zero (0) degree phase detector. Thus, clocks t0 and t4 are approximately one hundred eighty (180) degrees out of phase, such that t0 and t4# are in phase when the unit 500 is locked. The phase detector 604 sends adjustment information to a controller 605 to adjust the programmable delay cells until the clocks to and t4# are in phase.

Based on the error signal from the phase detector 604, the controller 605 adjusts the phase shift for delay cells (δ1–δ4) so that there is no substantial or significant difference between clocks t0 and t4#—they are in phase. In one implementation, the controller 605 digitally configures the phase shift angle of each delay cell (δ1–δ4).

In one embodiment, once these adjustments are performed, the generated clocks are substantially equally spaced through three hundred and sixty (360) degrees as illustrated in FIG. 7. That is, clocks t0, t1, t2, t3, and t4 are spaced from zero (0) to one hundred eighty (180) degrees from t0. Thus, the inverted version of these clocks t0#, t1#, t2#, t3#, and t4# are one hundred eighty (180) to three hundred sixty (360) degrees out of phase with t0. Hence, a full three hundred sixty (360) degrees of phase shift may be created by the multi-clock generator 500.

The delay cells may be chained or configured in various ways to provide the multiple phase-shifted clocks (e.g. to, t1, t2, etc.). In one implementation, shown in FIG. 6, the phase delayed clock generated by each delay cell (δ1–δ4) also serves as an input to the next delay cell. For instance, the clock generated by δ1 may serve as input to δ2, etc.

Figure 8:
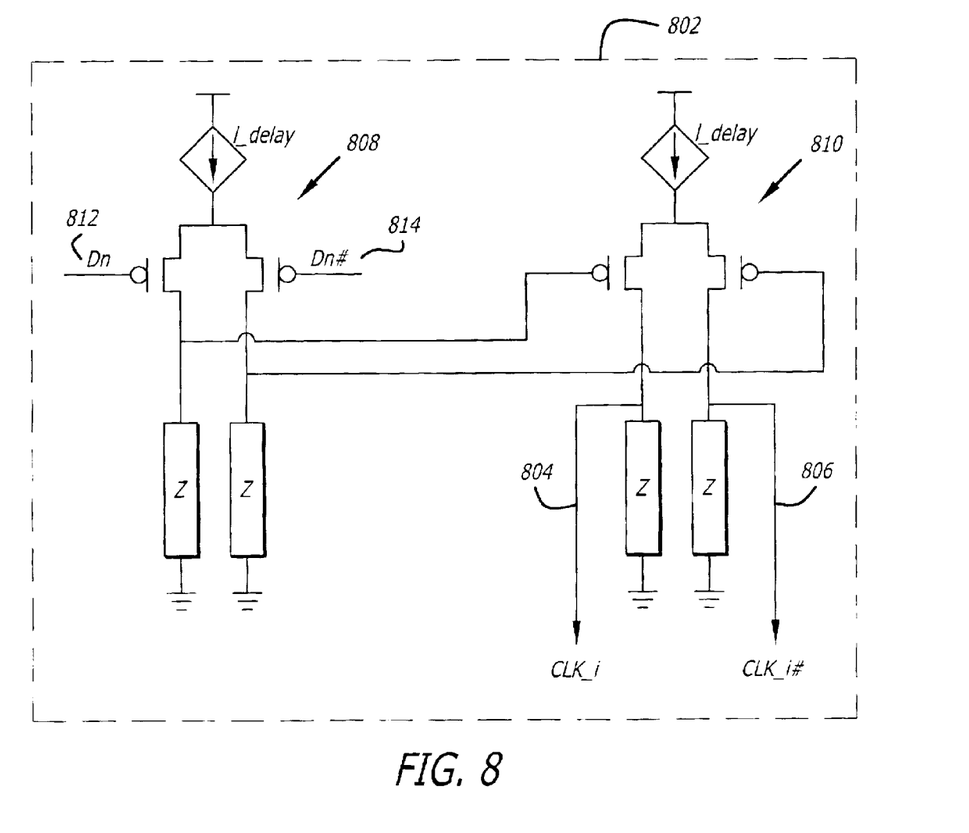
FIG. 8 is a block diagram illustrating one embodiment of a delay cell which provides a phase shifted clock.

FIG. 8 illustrates one embodiment of a delay circuit 802 which provides two phase shifted clocks 804 & 806 (clk_i & clk_i#), one hundred eighty (180) degrees apart. According to the implementation shown, a pair of differential amplifiers 808 & 810, each comprising two field effect transistors (FET), receive two input clocks 812 & 814 (Dn and Dn#) one hundred eighty (180) degrees shifted from each other, and produce two further delayed clocks (clk_i & clk_i#) also phase-shifted one hundred and eighty (180) degrees from each other.

While the exemplary embodiment in FIG. 8 has illustrated one way of providing a delay circuit for generating multiple clocks phase shifted from each other, the invention is not limited to such circuit or implementation. Rather, the invention may be practiced with any device, component, method, or system capable of providing one or more phase shifted clocks.

Figure 9A:
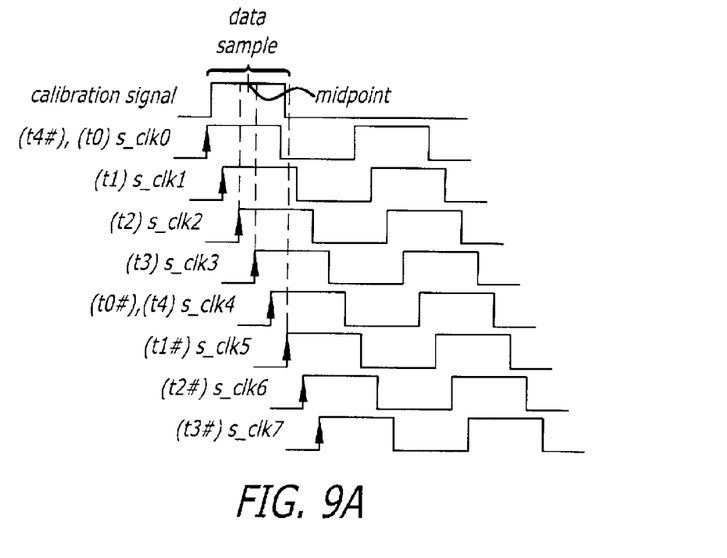
FIGS. 9A and 9B are waveform diagrams illustrating how the multiple sampling clocks that may be generated by the clock generator of FIG. 6 serves to over-sample a calibration pattern.

FIG. 9A illustrates an exemplary embodiment of the various waveforms that may be generated multi-clock generator of FIG. 6. A two-step initialization procedure of rough-tuning and then fine-tuning is employed to generate a desired clock. Ultimately, a single clock (e.g. a synchronization clock) is synthesized which lies at the mid-region of the data samples to accurately detect said samples.

First, from among the multiple clocks generated (e.g. s_clk0 through s_clk7), two sampling clocks are selected to accurately detect a known data pattern (initialization signal) transmitted from the DRAM subsystem 404. The multiple clocks (e.g. s_clk0 through s_clk7) serve to over-sample the received calibration data pattern.

According to one implementation, in selecting the two sampling clocks, a first clock is selected to lie on one side of the data sample midpoint and a second clock is selected to lie on the other side of the data sample midpoint. This may be accomplished in a number of ways, including by using an edge detector. For example, each data sample (data unit) within the calibration pattern may be over-sampled by the multiple phase-shifted clocks (s_clk0 through s_clk7). Adjacent data samples are then compared (by exclusive OR logic operations for instance) to determine where the data sample edge is located. Additionally, other means of edge detection may be employed without deviating from the invention.

Having located the edge locations, two sampling clocks, one on each side of the data sample midpoint, are then selected. In another embodiment, the two sampling clocks closest to each data sample edge and within the data sample (data unit) are selected.

Figure 9B:
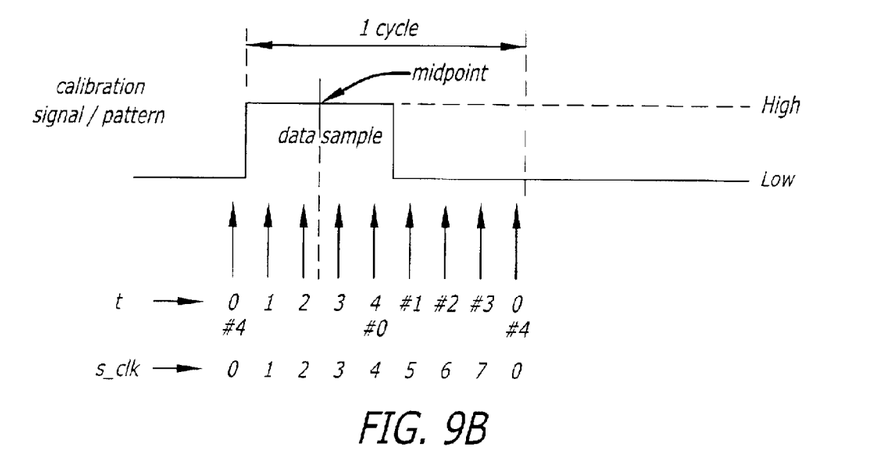

FIG. 9B is a more detailed example of the waveforms and clocks shown in FIG. 9A to illustrate the selection of the two sampling clocks. Each sampling clock (s_clk0–s_clk7) samples a data unit of the calibration data stream. By comparing the Low-to-High or High-to-Low transitions and the sample values (Low or High) the edges of the data unit may be determined. From this information, the two clocks which fall within the data unit (data sample) may be selected.

According to one embodiment, the clocks within the data unit and closest to the transition edge may be selected. For example, in FIG. 9B, clocks s_clk1, s_clk2, s_clk3, and s_clk4 fall within the data sample and, of these, clocks s_clk1 and s_clk4 are closest to each edge. Thus, clocks s_clk1 and s_clk4 would be selected for interpolation in the fine-tuning stage.

In another embodiment, the two clocks closest to the midpoint of the data sample are selected rather than the two clocks closest to the edges. By selecting the two clocks closest to the midpoint of the data sample, greater accuracy may be obtained in the fine-tuning stage. For example, in FIG. 9B, clocks s_clk2 and s_clk3 would be selected since they are closest to the midpoint of the calibration data unit (data sample).

Other methods of clock selection may be employed without deviating from the invention.

The selection of the two sampling clocks provides a coarse timing alignment for the data center (midpoint). Once the two sampling clocks are selected, a single fine-tuned sampling clock may be generated. Fine-tuning encompasses generating a clock capable of reliably sampling the data sample(s).

A single fine-tuned sampling clock may be synthesized by interpolating between the two selected clocks.

Figure 10:
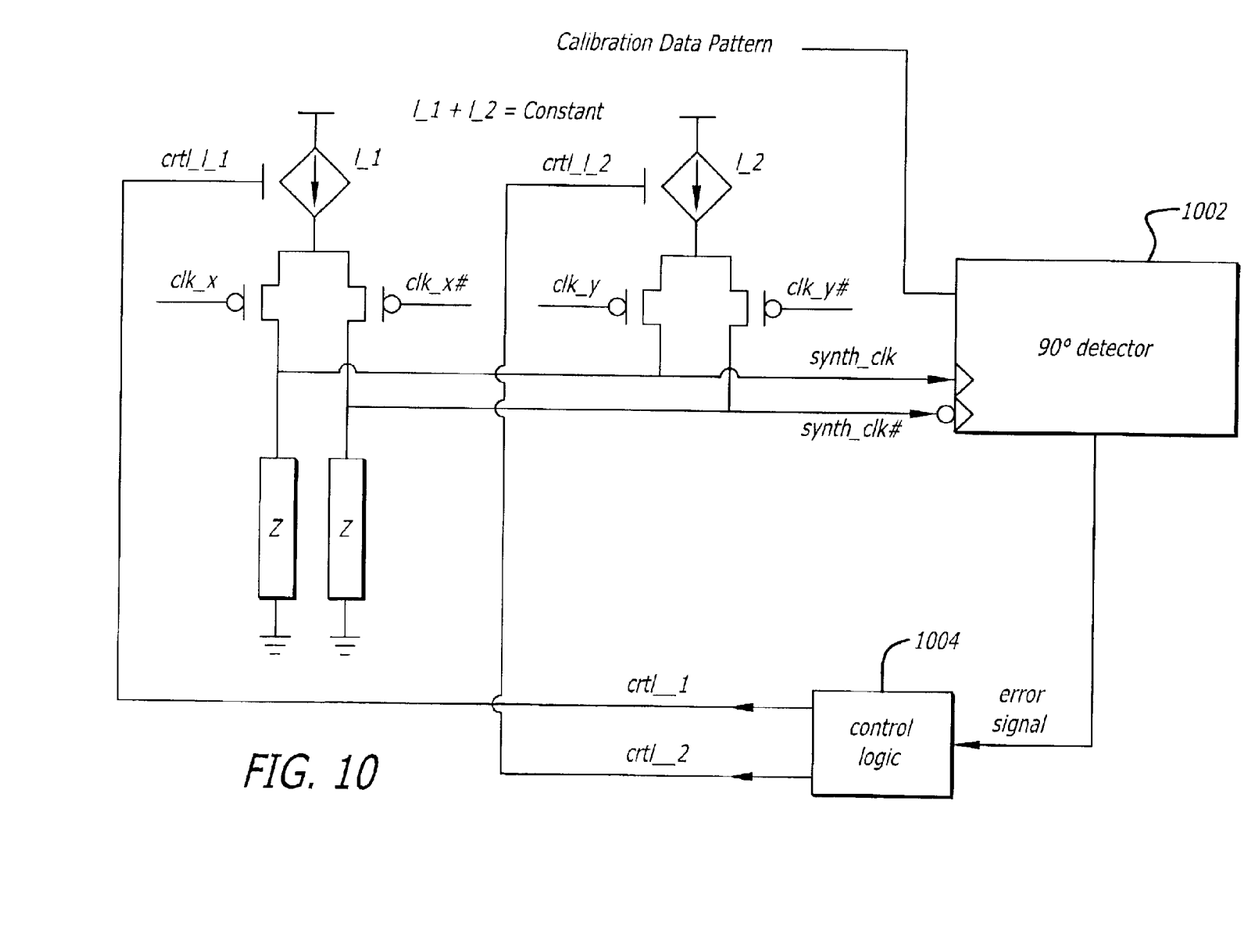
FIG. 10 is a block diagram illustrating one embodiment of an interpolation and fine-tuning circuit which interpolates two sampling clocks to provide a single synthesized clock.

FIG. 10 illustrates a block diagram of an exemplary embodiment of a fine-tuning circuit 502 according to one embodiment of the invention. The fine-tuning circuit 502 employs the two clocks (e.g. s_clk2 and s_clk3) selected in the rough-tuning stage (shown as clk_x and clk_y) to generate a single clock (synth_clk) which samples a calibration data pattern (initialization signal) substantially at its mid-region.

A pre-determined calibration data pattern, e.g. '10101010', is again sent from the DRAM subsystem. Other calibration patterns of different lengths and/or sequence may be used without deviating from the invention. The purpose of the pre-determined calibration sequence is to provide a reference by which the fine-tuning circuit can center its clock edge on transmitted data samples. The calibration pattern may be provided in response to a request or command by the interpolator circuit.

According to one embodiment, sampling clocks clk_x and clk_y may be combined to provide a synthesized clock synth_clk. Sampling clocks clk_x and clk_y are combined through the weighing of the tail currents, I_1 and I_2. For example, a fifty percent (50%) synth_clk, which is midway from clk_x and clk_y, may be created by setting the same amount of current in I_1 and I_2. Thus, the phase delay of the synth_clk may be adjusted as desired by controlling the tail currents I_1 and I_2.

According to one implementation, a ninety (90) degree phase detector 1002 compares the synthesized clock synth_clk and the calibration data pattern and provides an error signal to bring the synth_clk into approximately a ninety (90) degree phase shift with the calibration data stream/pattern. Any conventional device to accomplish such ninety (90) degree phase comparison may be employed without departing from the invention.

Figure 11:
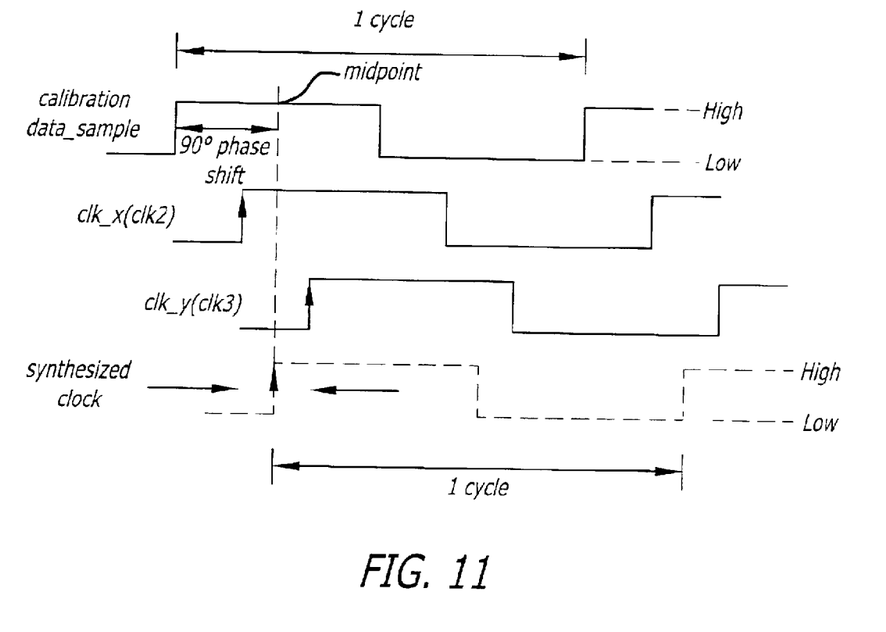
FIG. 11 is a waveform diagram illustrating how a synthesized clock is generated from two sampling clocks.

In one embodiment of the phase detector 1002, a phase comparison between the synth_clk and calibration data pattern is accomplished by comparing the amount of time the synth_clk and a calibration data pattern data unit overlap. Referring to FIG. 11, the logic High portion of the synthesized clock is combined with the logic High portion of the calibration data unit. During this time of overlapping, the detector charges up a capacitor. Once the calibration data returns to logic Low, while the synthesized clock remains at logic High, the detector discharges the capacitor. When these two waveforms are at ninety (90) degree, there is no net charge stored in the capacitor. That is, the charge in the capacitor over one cycle remains substantially the same.

Based on such phase difference information, the phase detector 1002 generates an error signal corresponding to the error/difference between the synth_clk and the calibration data pattern. If the synth_clk and calibration data pattern are not ninety (90) degrees out of phase, the detector 1002 generates an error signal indicating the magnitude and direction in which the synth_clk phase should be shifted to be ninety (90) degrees out of phase with the calibration data pattern.

Note that in another embodiment, sampling clocks clk_x# and clk_y# may also combined to provide an inverted synthesized clock synth_clk#. In such embodiment, both synth_clk and synth_clk# may be differentially compared with the calibration data pattern for greater accuracy.

A control logic 1004 varies the current source I_1 and I_2 to each regulating system, via feedbacks crtl_1 and crtl_2, such that, while the current stays substantially constant (I_1+I_2=constant), clocks clk_x and clk_y are shifted in the direction and magnitude indicated by the phase detector 1002.

In this manner, the interpolated clock (synth_clk) moves towards the mid-point of the received data units causing the data to be sampled or detected substantially in the mid-region of each received data sample.

FIG. 11 illustrates the operation of the fine-tuning circuit 502 in FIG. 10 to obtain a synthesized clock. The synthesized clock (synth_clk) represents the interpolated clock at the optimal sampling point, which is the ninety (90) degree detector lock point. Once the lock point is reached, the setting may be registered digitally.

According to one embodiment, the controller 1004 periodically performs the calibration procedure described above to avoid internal clock drift. In one embodiment, the calibration procedure may only involve the fine-tuning stage.

According to one embodiment, the first and/or second stage calibration signals/patterns are generated by the memory controller 402 sending a calibration command to the DRAM subsystem 404. In response to such calibration command, the memory subsystem 404 generates and sends the calibration data pattern to the memory controller 402.

In one implementation, the calibration pattern is transmitted over the data lines between the DRAM memory subsystem 404 and the memory controller 402. However, this has the disadvantage of slowing memory accesses while the clocks are calibrated. This may be the case for example where clocks are periodically calibrated to correct for clock drift.

In various embodiments, a processor may be employed to control the one or more components shown in FIG. 11. That is, the processor may generate instructions or signals to control the operation of the ninety (90) degree phase detector 1002, the controller 1004, and other components. The processor may also function as the phase detector 1002 and or controller 1004. A processor includes any general purpose processor, application specific integrated circuit (ASIC), digital signal processor (DSP), microprocessor, microcontroller, and any device that processes data.

Figure 12:
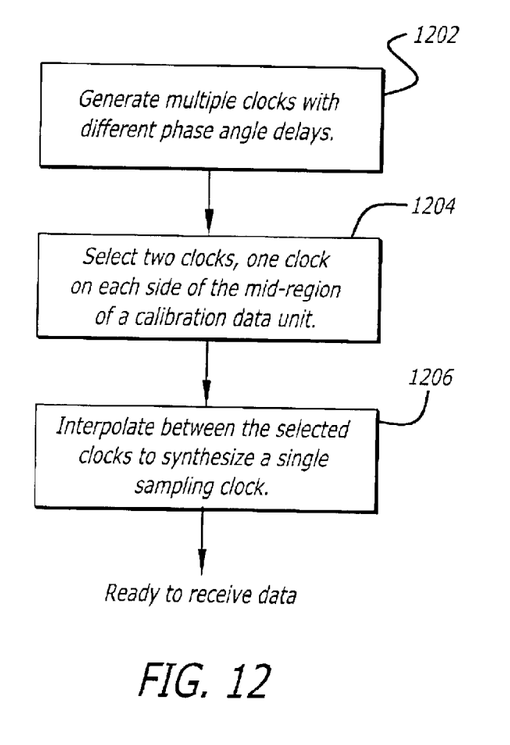
FIG. 12 illustrates one method of practicing the internal clock source invention.

In one embodiment, shown in FIG. 12, the internal clock source may be provided by first generating multiple clocks with different phase angles as described 1202. Two clocks are selected, with one clock located on each side of the mid-point of a sampled calibration data unit 1204. Adjustable interpolation is performed between these two clocks to generate a single sampling clock (e.g. synchronization clock) 1206 with an edge located substantially at the mid-point of the calibration data unit sampled.

Determining that a clock needs to be recalibrated or re-centered may be performed by any number of devices known in the art which detect when clock drift has occurred. In one implementation, the clock is automatically recalibrated after a specific amount of time.

While certain exemplary embodiments have been described and shown in the accompanying drawings, it is to be understood that such embodiments are merely illustrative of and not restrictive on the broad invention, and that this invention not be limited to the specific constructions and arrangements shown and described. Additionally, it is possible to implement the invention or some of its features in hardware, programmable devices, firmware, software or a combination thereof. The invention or parts of the invention may also be embodied in a processor readable storage medium or machine-readable medium such as a magnetic, optical, or semiconductor storage medium.

What is claimed is:

1. A method comprising:

generating a synchronization clock for sampling signals received by a first device from a memory subsystem and for reducing the number of interface lines between the first device and the memory subsystem, the synchronization clock generated by selecting a first sampling clock and a second sampling clock so that one clock lies on each side of the midpoint of a calibration data unit, the calibration data unit having transition edges with the midpoint of the calibration data unit centered approximately between with the transition edges, and interpolating between the first and second sampling clocks to synthesize the synchronization clock, one edge of the synchronization clock located substantially at the midpoint of the calibration data unit.

2. The method claim 1 further comprising:

generating a plurality of clocks of different phase angles from which the first and second sampling clocks are selected.

3. The method of claim 2 wherein the plurality of clocks have various phase delays ranging from zero to three hundred sixty degrees.

4. The method of claim 2 wherein the plurality of clocks serve to sample the calibration data unit, determine the transition edges of the calibration data unit, and select the first and second sampling clocks, from among the plurality of clocks, to lie within the calibration data unit.

5. The method of claim 2 wherein, from among the plurality of clocks, the two clocks closest to the transition edges of the calibration data unit, but within the calibration data unit, are selected as the first and second sampling clocks.

6. The method of claim 2 wherein, from among the plurality of clocks, the two clocks closest to either side of the calibration data unit midpoint and within the calibration data unit are selected as the first and second sampling clocks.

7. The method of claim 1 wherein interpolating between the first and second sampling clocks includes adjusting the contribution of the first and second sampling clocks to the synthesized synchronization clock to shift one edge of the synchronization clock to lie substantially at the midpoint of the calibration data unit.

8. The method of claim 1 wherein the synchronization clock and calibration data unit each include a leading transition edge, the leading transition edge of the synchronization clock is ninety degrees delayed from the leading transition edge of the calibration data unit.

9. A machine-readable medium having one or more instructions to generate a synchronization clock to sample an incoming synchronous data stream and reduce the number of interface lines between a first device and a memory subsystem, which when executed by a processor, causes the processor to perform operations comprising:
    selecting a first sampling clock and a second sampling clock with one clock on each side of the midpoint of a calibration data unit, the calibration data unit having transition edges with the midpoint of the calibration data unit centered approximately between with the transition edges; and
    interpolating between the first and second sampling clocks to synthesize the synchronization clock, one edge of the synchronization clock located substantially at the midpoint of the calibration data unit.

10. The machine-readable medium of claim 9 further comprising:
    generating a plurality of clocks of different phase angles from which the first and second sampling clocks are selected.

11. The machine-readable medium of claim 10 wherein the plurality of clocks have various phase delays ranging from zero to three hundred sixty degrees.

12. The machine-readable medium of claim 10 wherein the plurality of clocks serve to sample the calibration data unit, determine the transition edges of the calibration data unit, and select the first and second sampling clocks, from among the plurality or clocks, to lie within the calibration data unit.

13. The machine-readable medium of claim 10 wherein, from among the plurality of clocks, the two clocks closest to the transition edges of the calibration data unit but within the calibration data unit are selected as the first and second sampling clocks.

14. The machine-readable medium of claim 10 wherein, from among the plurality of clocks, the two clocks closest to either side of the calibration data unit midpoint and within the calibration data unit are selected as the first and second sampling clocks.

15. The machine-readable medium of claim 9 wherein interpolating between the first and second sampling clocks includes adjusting the contribution of the first and second sampling clocks to the synthesized synchronization clock to shift one edge of the synchronization clock to the substantially at the midpoint of the calibration data unit.

16. The machine-readable medium of claim 15 wherein the synchronization clock includes a leading edge, the leading edge of the synchronization clock is ninety degrees delayed from the leading edge of the calibration data unit.

17. An apparatus comprising:
    a receiver interface with one or more inputs to receive one or more data streams; and
    a clock synthesizer coupled to the receiver interface to generate an internal synchronization clock for sampling a received data stream, the clock synthesizer to generate the internal synchronization clock by detecting transition edges of a calibration data pattern, the clock synthesizer including,
        a clock generator to generate a plurality of sampling clocks,
        an edge detector coupled to the clock generator, the edge detector configured to sample the calibration data pattern using at least two of the sampling clocks and detect transition edges of the calibration data pattern, and
        a controller coupled to the edge detector, the controller configured to select a first and second sampling clocks from among the at least two sampling clocks and interpolate between the first and second sampling clocks to synthesize the internal synchronization clock.

18. The apparatus of claim 17 wherein the plurality of sampling clocks are of different phase angles.

19. The apparatus of claim 17 wherein the plurality of clocks are phase delayed from zero to three hundred sixty degrees.

20. The apparatus of claim 17 wherein the calibration data pattern includes at least one calibration data unit, the calibration data unit being defined by two transition edges, the plurality of clocks serve to sample one calibration data unit of the calibration data pattern, the edge detector is configured to determine the location of the transition edges of the calibration data unit, and the controller is configured to select the first and second sampling clocks to lie within the calibration data unit.

21. The apparatus of claim 20 wherein the controller is configured to select from among the plurality of clocks the two clocks closest to the transition edges of the calibration data unit but within the transition edges of the calibration data unit as the first and second sampling clocks.

22. The apparatus of claim 20 wherein the controller is configured to select from among the plurality of clocks the two clocks closest to either side of the calibration data unit midpoint, between the transition edges, and within the transition edges of the calibration data unit as the first and second sampling clocks.

23. The apparatus of claim 20 wherein interpolating between the first and second sampling clocks the controller is configured to adjust the contribution of the first and second sampling clocks to the synthesized internal synchronization clock to shift one edge of the clock to lie substantially at the midpoint between the transition edges of the calibration data unit.

24. The apparatus of claim 20 wherein the internal synchronization clock and calibration data unit each have a leading transition edge, the leading transition edge of the internal synchronization clock is ninety degrees delayed from the leading transition edge of the calibration data unit.

25. A system comprising:
    a memory subsystem to store data;
    a first device communicatively coupled to the memory subsystem to receive a data stream from the memory subsystem, the first device including
    a clock synthesizer to generate an internal synchronization clock for sampling the data stream by detecting transition edges of a calibration data pattern transmitted by the memory subsystem, the clock synthesizer including,
        a clock generator to generate a plurality of sampling clocks,
        an edge detector coupled to the clock generator, the edge detector configured to sample the calibration data pattern using at least two of the sampling clocks and detect transition edges of the calibration data pattern, and a controller coupled to the edge detector, the controller configured to select a first and second sampling clocks from among the at least two sampling clocks and interpolate between the first and second sampling clocks to synthesize synchronization clock for sampling data streams.

26. The system of claim 25 wherein the calibration data pattern includes at least one calibration data unit, the calibration data unit being defined by two transition edges, the plurality of clocks serve to sample one calibration data unit of the calibration data pattern, the edge detector is configured to determine the location of the transition edges of the calibration data unit, and the controller is configured to select the first and second sampling clocks to lie within the calibration data unit.

27. The system of claim 26 wherein the controller is configured to select from among the plurality of clocks the two clocks closest to the transition edges of the calibration data unit but within the transition edges of the calibration data unit as the first and second sampling clocks.

28. The system of claim 26 wherein interpolating between the first and second sampling clocks the controller is configured to adjust the contribution of the first and second sampling clocks to the synthesized internal synchronization clock to shift one edge of the clock to lie substantially at the midpoint between the transition edges of the calibration data unit.

29. The system of claim 26 wherein the controller is configured to select from among the plurality of clocks the two clocks closest to either side of the calibration data unit midpoint, between the transition edges, and within the transition edges of the calibration data unit as the first and second sampling clocks.

30. The system of claim 26 wherein the internal synchronization clock and calibration data unit each have a leading transition edge, the leading transition edge of the internal synchronization clock is ninety degrees delayed from the leading transition edge of the calibration data unit.

* * * * *